(12) United States Patent
Du et al.

(10) Patent No.: US 12,078,525 B2
(45) Date of Patent: Sep. 3, 2024

(54) VIBRATION SENSOR HAVING A SURFACE-INTEGRATED TRANSDUCER

(71) Applicant: Harman International Industries, Incorporated, Stamford, CT (US)

(72) Inventors: Yu Du, Chicago, IL (US); Darin Krajewski, White Lake, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 298 days.

(21) Appl. No.: 17/699,256

(22) Filed: Mar. 21, 2022

(65) Prior Publication Data

US 2023/0296428 A1    Sep. 21, 2023

(51) Int. Cl.
| | | |
|---|---|---|
| G01H 11/08 | (2006.01) | |
| B60R 1/12 | (2006.01) | |
| G01H 1/12 | (2006.01) | |
| H10N 30/30 | (2023.01) | |
| H10N 30/88 | (2023.01) | |

(52) U.S. Cl.
CPC .............. *G01H 11/08* (2013.01); *B60R 1/12* (2013.01); *G01H 1/12* (2013.01); *H10N 30/302* (2023.02); *H10N 30/88* (2023.02); *B60R 2001/1223* (2013.01)

(58) Field of Classification Search
USPC .......................................................... 73/597
See application file for complete search history.

(56) References Cited

U.S. PATENT DOCUMENTS

| | | | | |
|---|---|---|---|---|
| 6,420,975 B1 * | 7/2002 | DeLine | ................ | G06Q 20/341 |
| | | | | 381/86 |
| 6,906,632 B2 * | 6/2005 | DeLine | ............... | B60R 11/0217 |
| | | | | 381/86 |
| 7,370,983 B2 * | 5/2008 | DeWind | .................... | B60R 1/12 |
| | | | | 359/881 |
| 7,542,575 B2 * | 6/2009 | DeLine | ............... | H04M 1/6075 |
| | | | | 381/71.4 |
| 7,853,026 B2 * | 12/2010 | DeLine | ................ | G06Q 20/341 |
| | | | | 381/71.4 |
| 8,194,133 B2 * | 6/2012 | DeWind | ................. | B60K 35/10 |
| | | | | 348/148 |
| 8,908,039 B2 * | 12/2014 | De Wind | .................. | B60R 1/12 |
| | | | | 348/148 |
| 9,434,314 B2 * | 9/2016 | DeLine | ................ | G06Q 20/341 |
| 9,783,114 B2 * | 10/2017 | De Wind | ............... | B60K 35/10 |
| 10,131,280 B2 * | 11/2018 | De Wind | ............ | B60R 11/0235 |

(Continued)

FOREIGN PATENT DOCUMENTS

| | | |
|---|---|---|
| CN | 106379243 A | 2/2017 |
| DE | 102020112871 A1 | 11/2021 |

OTHER PUBLICATIONS

Anonymous: "Silver/ Mirror Car Window Tint", Jan. 27, 2022 (Jan. 27, 2022), pp. 1-1, XP093075163, Retrieved from the Internet: URL:https://web.archive.org/web/20220127144323/https://mrtints.co.uk/auto_products_mirror.html [retrieved on Aug. 21, 2023] * figure 1 * * p. 1*.

*Primary Examiner* — Clayton E. LaBalle
*Assistant Examiner* — Warren K Fenwick
(74) *Attorney, Agent, or Firm* — Angela M. Brunetti

(57) ABSTRACT

A vibration sensor assembly having a rigid surface and a transducer integrated with the rigid surface. The transducer measures structure-borne sound waves that cause vibration motion of the rigid surface. The rigid surface may be glass, metal or plastic and may be part of an interior part or panel, or an exterior panel, of a vehicle.

20 Claims, 2 Drawing Sheets

(56) References Cited

U.S. PATENT DOCUMENTS

| | | | |
|---|---|---|---|
| 2006/0164230 A1* | 7/2006 | DeWind | B60K 35/10 |
| | | | 340/461 |
| 2007/0245804 A1 | 10/2007 | Yoshida et al. | |
| 2015/0013454 A1 | 1/2015 | Lee et al. | |
| 2019/0130756 A1 | 5/2019 | Ghannam et al. | |
| 2022/0227308 A1* | 7/2022 | Wheeler | B60R 11/0247 |

* cited by examiner

VIBRATION SENSOR HAVING A SURFACE-INTEGRATED TRANSDUCER

TECHNICAL FIELD

The present disclosure relates to a vibration sensor having a surface-integrated transducer.

BACKGROUND

Hands-free communication systems (telephone, voice recognition, speech-to-text, etc.), and systems that are designed to create a quiet cabin (active noise cancellation (ANC) and road noise cancellation (RNC) systems) are just a few examples of vehicle systems that operate using speakers and microphones mounted to an interior or to an exterior surface of the vehicle. Advancements in such vehicle systems typically require microphone sensors that are placed in strategic locations. For example, a hands-free communication system uses one or more microphones that are positioned close to a user's head, such as an overhead console or in a headliner. However, such microphone sensors are normally visible because they need acoustic transparent air-paths (e.g., a grill or other opening) through which sound waves can be detected. In addition, installations of microphone sensors typically required dedicated spaces within the vehicle structure, such as an overhead console and/or a headliner.

As vehicle designs become more streamlined and minimal, there is a balance to strike between having sensors, such as microphone sensors, that are necessary for advanced features in vehicle systems that are desired by customers and a clean look desired by customers where the sensors are not readily visible and/or require dedicated installation spaces. For example, in panoramic sunroof designs that incorporate a windshield with an entire rooftop made of glass, there is no longer as much space available in an overhead console or headliner, resulting in less surface area to mount and package sensors.

Additionally, vehicle systems may use sound detection on the vehicle exterior. For example, voice commands to unlock a door, open a trunk, roll down a window. These sensors are located outside of the vehicle and are subject to harsh environmental conditions that can damage the sensors causing their performance to degrade making the unreliable.

SUMMARY

A sensor having a surface structure and a transducer integrated with the backside of the surface structure. The transducer measures structure-borne vibrations carried by the surface structure. In one or more embodiments, the transducer is a piezo-diaphragm based vibration sensor completely enclosed by a housing and the housing is integrated with the backside of the surface structure. In one or more embodiments, the surface structure is at least one of glass, metal, and plastic.

A sensor assembly having a support frame, a mirrored glass surface within the support frame, a housing integrated with a backside of the mirrored glass surface, and a transducer enclosed in the housing, the transducer measures structure-borne sound waves carried by the mirrored glass surface. In one or more embodiments, the support frame is mounted to an interior surface of a vehicle. In one or more embodiments, the support frame is mounted to an exterior surface of a vehicle.

A vibration sensor having a rigid surface of at least one of glass, metal, and plastic, and a transducer integrated with the rigid surface, the transducer measures structure-borne sound waves that cause vibration motion of the rigid surface. In one or more embodiments, the vibration motion is measured as acceleration. In one or more embodiments, the vibration motion is measured as velocity. In one or more embodiments, the vibration motion is measured as displacement or deformation. In one or more embodiments, the vibration motion is measured as strain or stress.

Elements and steps in the figures are illustrated for simplicity and clarity and have not necessarily been rendered according to any sequence. For example, steps that may be performed concurrently or in different order are illustrated in the figures to help to improve understanding of embodiments of the present disclosure.

DETAILED DESCRIPTION

While various aspects of the present disclosure are described with reference to a surface-integrated vibration sensor, the present disclosure is not limited to such embodiments, and additional modifications, applications, and embodiments may be implemented without departing from the present disclosure. In the figures, like reference numbers will be used to illustrate the same components. Those skilled in the art will recognize that the various components set forth herein may be altered without varying from the scope of the present disclosure.

Figure 1:
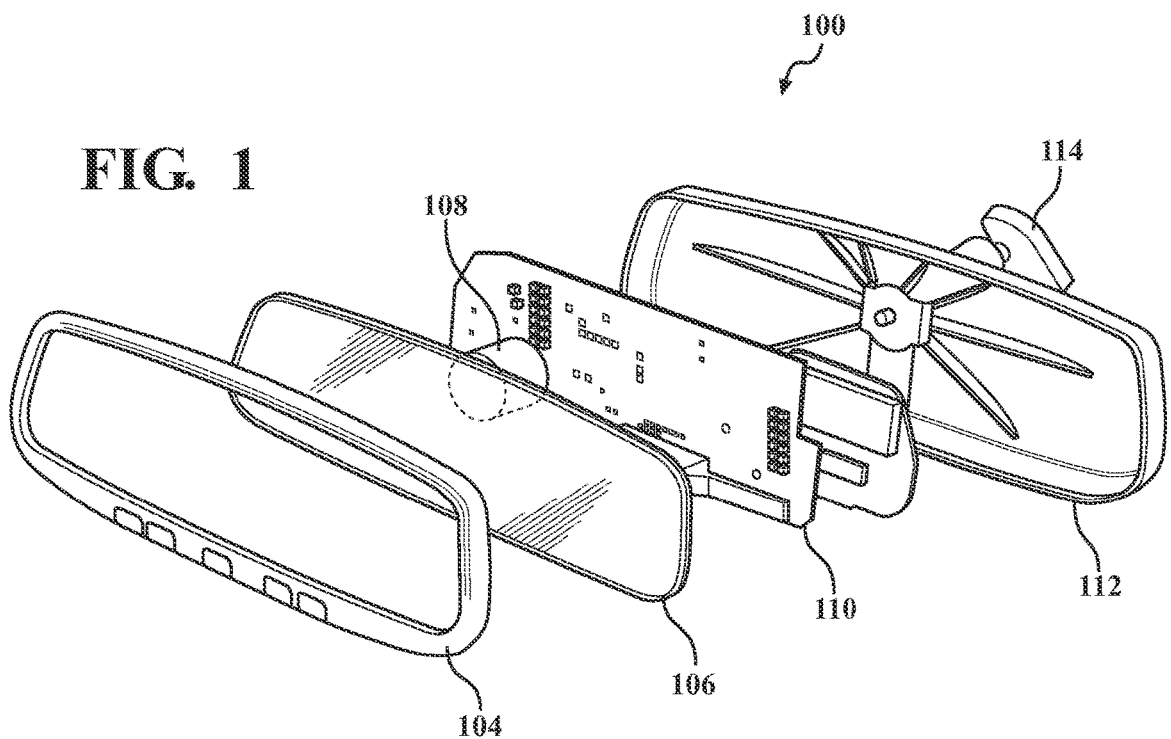
FIG. 1 is an exploded view of a surface-integrated vibration sensor assembly shown as a mirror assembly.

FIG. 1 is an exploded view of a surface-integrated vibration sensor assembly 100, shown as a mirror assembly in the present example, having a frame 104, also called a support frame or support structure, supporting a rigid surface 106, also called a surface structure, which, in the present example, is mirrored glass surface. A transducer 108, such as a vibration sensor, is integrated to one side of the surface 106. The transducer 108 is also connected to a printed circuit board assembly 110 that provides power and signal conditioning to the transducer 108. A back housing 112 attached to the frame 104 supports the surface 106, transducer 108 and printed circuit board assembly 110. In one or more examples, a mounting element 114 extends from the back housing 112 may attach the surface-integrated transducer assembly 100 to a front windshield glass of a vehicle (not shown in FIG. 1).

The surface-integrated vibration sensor assembly 100 is integrated, in the present example, to the surface 106 to sense vibrations of the surface 106 induced by structure-borne sound, such as speech energy. It should be noted that the surface 106 in FIG. 1 is shown to be part of a rearview mirror assembly in the present example, but the surface-integrated vibration sensor assembly 100 may also be incorporated into other surfaces. For example, the surface 106 may consist of a glass surface such as an exterior side mirror. Additionally, or alternatively, the surface 106 may consist of an interior panel such as a console, pillar structure, or instrument panel. Additionally, or alternatively, the surface may consist of an exterior vehicle body panel or an interior facing body panel such as an interior door or floor panel.

In either an interior or exterior surface 106, the transducer 108 is sensing structure-borne, sound induced structural vibrations and not direct sound waves propagating in air. Therefore, the surface-integrated vibration sensor assembly 100 does not require a transparent path for airborne soundwaves, such as a grill or vent. The transducer 108 is fully integrated into the surface 106 keeping transducer 108 from being visible to a vehicle user. Further, the transducer 108 being integrated into the surface 106 keeps the transducer 108 fully sealed from the environment in which it is being used, making the vibration sensor assembly 100 much more durable and damage resistant when compared to a traditional microphone sensor that senses airborne sound waves by way of a vent or grill that is exposed to harsh environmental conditions.

The surface-integrated vibration sensor assembly 100 is sensing sound as it is transmitted through a solid structure. The surface-integrated vibration sensor assembly 100 has a transducer 108 that may be, for example, a piezo-diaphragm based sensor, such as described in U.S. patent application Ser. No. 17/332,488 and U.S. patent application Ser. No. 17/332,492, incorporated herein by reference. When sound vibrations hit the solid structure of surface 106, they generate vibrations. The vibrations are then measured by the transducer 108, in this example, the transducer 108 is the piezo-diaphragm based sensor integrated into surface 106.

In the example shown in FIG. 1, transducer 108 is the piezo-diaphragm based sensor, which is designed to sense acceleration (i.e., an accelerometer). However, vibration motions in a structure can present in many forms including acceleration, velocity, displacement or deformation, strain, and stress. Therefore, it is possible that other types of transducers 108 that measure any physical quantity related to structure vibration may also be integrated into the surface 106 and the piezo-diaphragm based sensor is but one example. The transducer 108 measures the vibration (i.e., acceleration) of the surface 106, which is a base structure to which the transducer 108 is integrated, regardless of the source of the vibration. In the case, where the structure vibration is excited by sound, the transducer 108 then picks up the sound signal and functions as a microphone. In case the surface-integrated vibration sensor assembly 100 is being used for an application that is detecting speech, the transducer 108 may be used in connection with voice command applications. In case the surface-integrated vibration sensor assembly 100 is being used for an application that is detecting background noise, the transducer 108 may detect signals that can be used in the ANC/RNC system.

In FIG. 1, the transducer 108 itself is integrated directly into the surface 106 and the integrated transducer 108 and surface 106 are enclosed, along with the PCB 110, in the frame 104 and housing 112 of the sensor assembly. This configuration of the transducer 108 makes it especially advantageous for use in a vehicle interior. Compared to a typical microphone sensor, the vibration sensor assembly 100 is entirely hidden and does not require any additional installation space in the vehicle.

Figure 2:
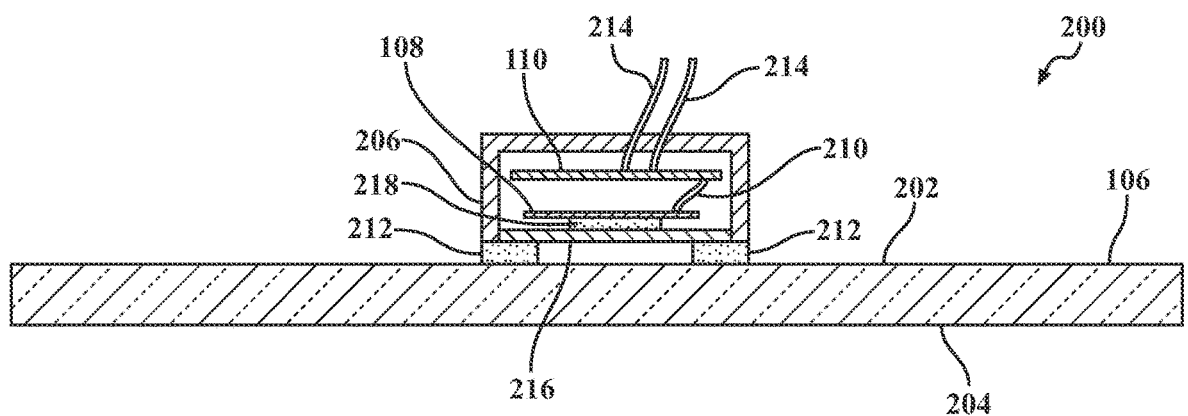
FIG. 2 is a transducer integrated to a surface.

FIG. 2 shows a surface-integrated vibration sensor assembly 200 having the transducer 108 enclosed in a housing 206 and the housing 206 is integrated into the surface 106. The surface 106 has a first side 202, for example, an inner surface or a rear face, of the rearview mirror and a second side 204, for example the outer surface or front face of the rearview mirror. The first side 202 of the surface 106 is not visible when viewing the vibration sensor 200 from the second side 204. Therefore, the transducer 108 is not visible from the second side 204 of surface 106.

The housing 206 completely encases the transducer 108, the printed circuit board assembly 110 and a pair of electrical wires 210 coupled between the transducer 108 and the printed circuit board assembly 110. Additionally, signal lead wires 214 are accessible from outside the housing 206 for the transducer 108 to transmit signals, detected and measured by the transducer 108, of structure-borne vibrations, caused by sound, that occur at the surface 106. The signal is indicative of sound detected at the surface 106.

In FIG. 2, the transducer 108 is enclosed within the housing 206, and the housing 206 is integrated with the first side 202 of the surface 106, such as by an adhesive layer 212. The surface-integrated vibration sensor 200 is integrated with the surface 106 at the first side 202 so it is not visible from the second side 204. The housing 206 is integrated into the surface 106. This configuration is especially advantageous for use in a vehicle exterior, such as a side mirror, because the transducer 108 is sealed inside housing 206 and is protected from potentially harsh environmental conditions.

The piezo-diaphragm based transducer 108 may be attached to a side wall of the housing along a circumferential edge, or it may be rigidly connected to a bottom side 216 of the housing 206 through an adhesive layer 218. Additionally, or alternatively, the bottom side 216 of the housing 206 may be integrated to the first side 202 of the surface 106, for example, with more, or less surface area contact with adhesive layer 212. A sensitivity of the sensor assembly 200 may be adjusted by altering a thickness and contact area between any one or more of the transducer 108, the housing 206, and/or the bottom side 216 with one or more of the adhesive layers 212 or 218.

Additionally, it should be noted that signal processing, filtering, etc. may occur either at the printed circuit board assembly 110 at the sensor or at other locations or at another hardware location that is in communication with the vibration sensor assembly 100, 200. For example, most noise energy inside a vehicle cabin is concentrated at low frequencies that are relatively less critical for speech intelligibility. Therefore, a high pass filter (not shown) with a cutoff frequency between 100 and 500 Hz may be used to clean the signal sensed by vibration sensor assembly 100, 200. The high pass filter may be implemented with either analog or digital circuitry residing on the printed circuit board assembly 110 or in hardware located at a vehicle infotainment system (also not shown).

Figure 3:
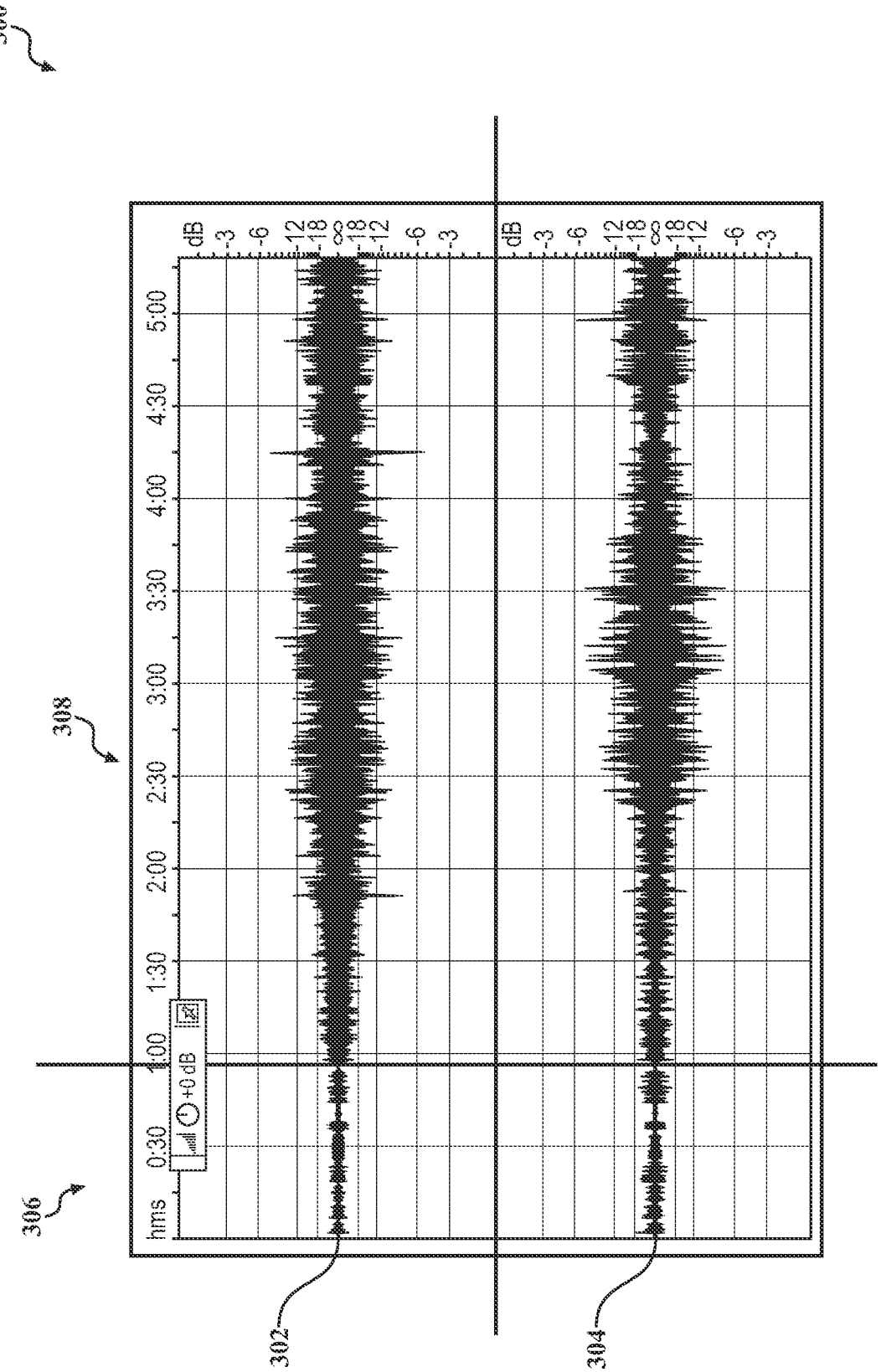
FIG. 3 is a graph comparing speech waveforms recorded with a surface-integrated vibration sensor and an acoustic omnidirectional microphone.

FIG. 3 is a comparison graph 300 of speech sound waves recorded under varying vehicle driving conditions. Speech sound waves recorded using the vibration sensor are compared to speech sound waves recorded using an acoustic omni-directional microphone. Two channels of audio recordings were taken simultaneously with the vehicle in park and in motion. The top plot 302 shows the recording from the rearview mirror surface-integrated vibration sensor described herein. For comparison, the bottom plot 304 shows the recording from an acoustic microphone mounted at the overhead console location close to the rearview mirror. The left portion 306 of the graph is the result of recording speech while the vehicle is parked. The right portion 308 of the graph is the result of recording speech while the vehicle is travelling at a speed between 20-50 miles per hour.

As indicated in the graph 300, the sensitivity of the surface-integrated vibration sensor is comparable to the sensitivity of the acoustic omni-directional microphone, making it a viable alternative to a regular acoustic microphone, but with many more possible locations inside and outside of the vehicle. The surface-integrated vibration sensor remains completely hidden and does not require transparent pathways that are necessary for the acoustic microphone. The surface-integrated vibration sensor has a sensor that is completely enclosed making it impervious to harsh environmental conditions it would be exposed to when used on the exterior of the vehicle, thereby making it a practical solution for use externally where a traditional microphone would not be practical.

In the foregoing specification, the present disclosure has been described with reference to specific exemplary embodiments. The specification and figures are illustrative, rather than restrictive, and modifications are intended to be included within the scope of the present disclosure. Accordingly, the scope of the present disclosure should be determined by the claims and their legal equivalents rather than by merely the examples described.

For example, the steps recited in any method or process claims may be executed in any order, may be executed repeatedly, and are not limited to the specific order presented in the claims. Additionally, the components and/or elements recited in any apparatus claims may be assembled or otherwise operationally configured in a variety of permutations and are accordingly not limited to the specific configuration recited in the claims. Any method or process described may be carried out by executing instructions with one or more devices, such as a processor or controller, memory (including non-transitory), sensors, network interfaces, antennas, switches, actuators to name just a few examples.

Benefits, other advantages, and solutions to problems have been described above regarding embodiments; however, any benefit, advantage, solution to problem or any element that may cause any particular benefit, advantage, or solution to occur or to become more pronounced are not to be construed as critical, required, or essential features or components of any or all the claims.

The terms "comprise", "comprises", "comprising", "having", "including", "includes" or any variation thereof, are intended to reference a non-exclusive inclusion, such that a process, method, article, composition, or apparatus that comprises a list of elements does not include only those elements recited but may also include other elements not expressly listed or inherent to such process, method, article, composition, or apparatus. Other combinations and/or modifications of the above-described structures, arrangements, applications, proportions, elements, materials, or components used in the practice of the present disclosure, in addition to those not specifically recited, may be varied, or otherwise particularly adapted to specific environments, manufacturing specifications, design parameters or other operating requirements without departing from the general principles of the same.

What is claimed is:

1. A sensor comprising:
    a surface structure having a front side and a backside; and
    a transducer integrated with the backside of the surface structure, the transducer measures structure-borne vibrations carried by the surface structure.

2. The sensor of claim 1, wherein the transducer is a piezo-diaphragm based vibration sensor completely enclosed by a housing and the housing is integrated with the backside of the surface structure.

3. The sensor of claim 1, wherein the surface structure is selected from a group consisting of: at least one of glass, metal, and plastic.

4. The sensor of claim 3, wherein the surface structure is glass, and the glass is mirrored.

5. The sensor of claim 4, further comprising:
    a frame encasing the surface structure and transducer; and
    a mounting element for mounting the frame to a surface of a vehicle.

6. The sensor of claim 5, wherein the mounting element mounts the frame to an interior surface of the vehicle and the transducer measures sound induced vibrations inside the vehicle.

7. The sensor of claim 5, wherein the mounting element mounts the frame to an exterior surface of the vehicle and the transducer measures sound induced vibrations outside the vehicle.

8. A sensor assembly comprising:
    a support frame;
    a mirrored glass surface within the support frame;
    a housing integrated with a backside of the mirrored glass surface; and
    a transducer attached to a side wall of the housing along a circumferential edge, or attached to a bottom edge of the housing, the transducer measures structure-borne sound waves carried by the mirrored glass surface.

9. The sensor assembly of claim 8, wherein the support frame is mounted to an interior surface of a vehicle.

10. The sensor assembly of claim 8, wherein the support frame is mounted to an exterior surface of a vehicle.

11. The sensor assembly of claim 8, wherein the transducer is a piezo-diaphragm based vibration sensor.

12. The sensor assembly of claim 11, wherein the piezo-diaphragm based vibration sensor is completely enclosed in the housing and a bottom side of the housing is rigidly integrated with the backside of the mirrored glass surface.

13. The sensor assembly of claim 11, wherein one surface of the piezo-diaphragm based vibration sensor is rigidly integrated directly to the backside of the mirrored glass surface and the housing encloses all other surfaces of the piezo-diaphragm based vibration sensor.

14. A vibration sensor, comprising:
    a rigid surface selected from a group consisting of at least one of; glass, metal, and plastic; and
    a transducer integrated with the rigid surface, the transducer measures structure-borne sound waves that cause vibration motion of the rigid surface.

15. The vibration sensor of claim 14, wherein vibration motion of the rigid surface is measured as acceleration.

16. The vibration sensor of claim 14, wherein vibration motion of the rigid surface is measured as velocity.

17. The vibration sensor of claim 14, wherein vibration motion of the rigid surface is measured as displacement or deformation.

18. The vibration sensor of claim 14, wherein vibration motion of the rigid surface is measured as strain or stress.

19. The vibration sensor of claim 14, further comprising:
    a housing integrated with the rigid surface; and
    the transducer is rigidly connected to a bottom side of the housing.

20. The vibration sensor of claim 14, further comprising:
    a housing having a bottom surface;
    a bottom side of the bottom surface of the housing is rigidly connected to the rigid surface; and
    the transducer is rigidly connected to a top side of the bottom surface of the housing.

* * * * *